(12) United States Patent
Jiao et al.

(10) Patent No.: US 9,469,559 B2
(45) Date of Patent: Oct. 18, 2016

(54) GLASS MANUFACTURING SYSTEM INCORPORATING AN OPTICAL LOW-COHERENCE INTERFEROMETRY ASSEMBLY

(71) Applicant: PPG INDUSTRIES OHIO, INC., Cleveland, OH (US)

(72) Inventors: Yu Jiao, Blawnox, PA (US); James W. McCamy, Export, PA (US); David Hanekamp, Oakmont, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 162 days.

(21) Appl. No.: 14/314,238

(22) Filed: Jun. 25, 2014

(65) Prior Publication Data
US 2015/0000345 A1 Jan. 1, 2015

Related U.S. Application Data

(60) Provisional application No. 61/839,899, filed on Jun. 27, 2013.

(51) Int. Cl.
 *C03B 18/02* (2006.01)
 *C03C 17/00* (2006.01)
 *G01B 9/02* (2006.01)
 *G01B 11/14* (2006.01)
 *C03B 17/06* (2006.01)
 *C03B 18/04* (2006.01)

(52) U.S. Cl.
 CPC ............. *C03B 18/02* (2013.01); *C03B 17/064* (2013.01); *C03B 18/04* (2013.01); *C03C 17/002* (2013.01); *G01B 9/02091* (2013.01); *G01B 11/14* (2013.01); *C03C 2218/152* (2013.01)

(58) Field of Classification Search
None
See application file for complete search history.

(56) References Cited

U.S. PATENT DOCUMENTS

| | | | |
|---|---|---|---|
| 3,951,100 A * | 4/1976 | Sopko | C03C 17/00 118/729 |
| 4,466,562 A | 8/1984 | DeTorre | |
| 4,671,155 A | 6/1987 | Goldinger | |
| 5,707,412 A * | 1/1998 | Franz | C03B 35/16 427/133 |
| 2006/0012804 A1* | 1/2006 | Wilke | G01B 11/06 356/632 |

(Continued)

FOREIGN PATENT DOCUMENTS

| | | |
|---|---|---|
| GB | 1386007 | 3/1975 |
| WO | 2013019776 A2 | 2/2013 |

OTHER PUBLICATIONS

Volkov et al., Automated Multichannel System for In-Line Monitoring of Float-Glass Ribbon Thickness in the Hot Zone of an Annealing Furnace, Glass and Ceramics, vol. 65 Nos. 5-6, pp. 144-147, 2008.*

(Continued)

*Primary Examiner* — Lisa Herring
(74) *Attorney, Agent, or Firm* — Andrew C. Siminerio

(57) ABSTRACT

A float glass system (10) includes a float bath (14) having a pool of molten metal (16). A chemical vapor deposition coater (32) is located in the float bath (14) above the pool of molten metal (16). The coater (32) includes at least one low-coherence interferometry probe (38) located in or on the coater (32) and connected to a low-coherence interferometry system (36). Another low-coherence interferometry probe 138 can be located outside an exit end of the float bath (14) and connected to the same or another low-coherence interferometry system (36).

15 Claims, 10 Drawing Sheets

(56) References Cited

U.S. PATENT DOCUMENTS

| | | | |
|---|---|---|---|
| 2006/0150678 A1 | 7/2006 | Chen et al. | |
| 2008/0014349 A1* | 1/2008 | Otani | C03C 17/225 427/255.19 |
| 2010/0068384 A1* | 3/2010 | Rosenbaum | C23C 16/54 427/255.28 |
| 2012/0127487 A1 | 5/2012 | Potapenko | |

OTHER PUBLICATIONS

Novacam, "A Solution for NDT Inspection", NDT Magazine, Mar. 31, 2009, 5 pages.*

Thomae et al., "Non-contact thickness measurement and dimension check", Kanch, Dec. 2011, pp. 7-8.*

Novacam, "How low-coherence interferometry works", http://novacam.com/technology/how-lci-works, Oct. 16, 2011.*

Zhang, "Novel Optical Sensors for High Temperature Measurement in Harsh Environments", Virginia Polytechnic Institute, Jul. 2003, known internet availability Sep. 2003).*

PCT Search Report, PCT/US2014/044027, dated Nov. 26, 2014.

J. Rasanen et al: "On-Line Measurement of the Thickness and Optical Quality of Float Glass With a Sensor Based on a Diffractive Element", Applied Optics, vol. 40, No. 28, Oct. 1, 2001, pp. 5034-5039, XP055140057.

M. Haruna et al: "Simultaneous Measurement of the Phase and Group Indices and the Thickness of Transparent Plates by Low-Coherence Interferometry", Optics Letters, vol. 23, No. 12, Jun. 15, 1998, pp. 966-968, XP000766610.

* cited by examiner

GLASS MANUFACTURING SYSTEM INCORPORATING AN OPTICAL LOW-COHERENCE INTERFEROMETRY ASSEMBLY

CROSS-REFERENCE TO RELATED APPLICATION

This application claims priority to U.S. Provisional Application Ser. No. 61/839,899, filed Jun. 27, 2013, herein incorporated by reference in its entirety.

BACKGROUND OF THE INVENTION

1. Field of the Invention

This invention relates generally to glass manufacturing processes and, more particularly, to glass manufacturing processes incorporating one or more optical low-coherence interferometry (OLCI) systems to determine a thickness or thickness profile of a glass ribbon. In one exemplary aspect, the invention also relates to a float glass system incorporating one or more optical low-coherence interferometry (OLCI) systems to determine a coater gap with respect to a coater located in a float bath.

2. Technical Considerations

In a conventional float glass process, glass batch materials are melted in a furnace to form a glass melt. The glass melt is poured onto the top of a pool of molten metal, typically molten tin, at the entrance end of a float bath. The glass melt spreads out over the top of the molten tin to form a glass ribbon. This glass ribbon is stretched and pulled by mechanical devices in the float bath to provide the glass ribbon with a desired uniform thickness or a desired thickness profile (i.e., contour or thickness variation across the width of the ribbon). The glass ribbon exits the float bath and can be transported to a lehr for controlled cooling to strengthen or temper the glass, if desired.

While in the float bath, one or more coatings can be applied onto the top of the glass ribbon by a conventional chemical vapor deposition (CVD) coating process. In this in-bath CVD coating process, vaporized coating materials are transported to one or more coaters positioned in the float bath above the glass ribbon. The coating materials exit the bottom of the coater(s) and are deposited on top of the glass ribbon to form a coating. The structure and operation of a conventional float glass process as well as that of a conventional CVD coating process will be well understood by one of ordinary skill in the art and, therefore, will not be described in detail.

During the coating process in the float bath, the coater gap, i.e., the distance between the bottom of the CVD coater and the top of the hot float glass ribbon, is important for the coating process. This distance impacts the color uniformity of the resultant coating and also the thickness of the coating. Further, this coater gap is important for the safety of the coater, which could be damaged if the coater accidentally contacts the underlying hot glass ribbon. In a conventional float glass system, the in-bath CVD coater is typically only about 0.2 inches (0.5 centimeters) above the top of the hot glass ribbon, which can be on the order of about 1,400° F. (760° C.).

In most conventional float glass systems, the distance of the CVD coater above the glass ribbon is set or adjusted by an operator relying on visual observation and past coating experience. Typically, the operator looks through a window on the side of the float bath and judges whether the coater gap he observes is correct based on his practice and experience. If he determines that the coater gap is incorrect or needs adjustment, the operator uses a movement system connected to the coater to raise or lower the coater and then visually reassesses whether the new coater gap looks correct. Further, the uniformity of the coater gap across the coating area (i.e. the parallelism between the bottom of the coater and the top of the glass ribbon) is important. If the coater is tilted with respect to the top of the glass ribbon, this can adversely impact the coating process and the resultant coating and could lead to coater damage if a portion of the coater accidentally contacts the hot glass ribbon.

Additionally, the thickness of the glass ribbon is important. The desired glass ribbon thickness depends upon the final use of the glass being made and must be within certain tolerances for the glass to be commercially acceptable for its intended purpose. The glass ribbon thickness is dependent upon such factors as the rate of addition of the glass melt into the float bath and the travel speed of the glass ribbon through the float bath. Therefore, the operators of the glass furnace and/or the float bath need to know whether the thickness of the glass ribbon exiting the float bath is within the specified limits for the final product. However, the glass ribbon thickness as it exits the float bath is difficult to measure due to the high temperature of the glass ribbon, the flexibility of the hot glass ribbon, and the fact that the glass ribbon is typically tilted as it exits the float bath. It is particularly difficult to accurately measure the thickness of glass ribbons greater than 10 millimeters thick. If the glass ribbon thickness is out of specification, the resultant glass sheets cannot be used for their intended purpose, thus decreasing the productivity of the float glass process. By reducing the time the thickness of the glass ribbon is out of specification, the yield of the float glass process can be increased.

Glass can also be formed using a downdraw process, in which the glass ribbon moves vertically downwardly under the force of gravity as it cools. Examples of downdraw processes include the slot downdraw process, in which molten glass flows out of a slot below the glass furnace to form a glass ribbon; and the fusion (or overflow) downdraw process in which molten glass overflows the opposed sides of a forming trough and the two glass films fuse below the trough to form a glass ribbon. In a downdraw process, as in a float glass process, the thickness of the glass ribbon is an important factor.

It would be desirable to provide a more convenient and accurate way of determining the glass ribbon thickness in a glass manufacturing process that reduces or eliminates at least some of the problems associated with known processes. For example, it would be desirable for float bath operators to have a less subjective way of setting the coater gap in a float glass system to prevent accidental contact of the coater with the glass ribbon and/or to improve the coating process. For example, it would be desirable to provide a more convenient and accurate way of determining the glass ribbon thickness either in the float bath and/or after the glass ribbon exits from the float bath. For example, it would be desirable to provide a glass ribbon thickness measurement system for glass ribbons thicker than about 10 mm. For example, it would be desirable to provide a system that could not only simplify the setting of the coater gap but which also allows for determining the glass ribbon thickness and/or the thickness of a coating on the glass ribbon. For example, it would be desirable to provide a more convenient and accurate way of determining the glass ribbon thickness in a downdraw glass manufacturing process.

SUMMARY OF THE INVENTION

A glass manufacturing system, in which molten glass is cooled to form a glass ribbon moving along a glass ribbon path, comprises at least one optical low-coherence interferometry probe located adjacent the glass ribbon path. An optical low-coherence interferometry (OLCI) system is operatively connected to the at least one probe. Examples of glass manufacturing systems useful for practice with the invention include a float glass system and a downdraw system.

A float glass system comprises a float bath having a pool of molten metal. At least one chemical vapor deposition coater is located in the float bath above the pool of molten metal. At least one optical low-coherence interferometry probe is connected to the at least one coater, such as attached to the coater or located in the coater, and is connected to an optical low-coherence interferometry system.

If located in the coater, the at least one probe can be located adjacent to at least one transparent window on a bottom of the coater.

Two or more probes can be positioned at a spaced distance from each other on the coater. For example, the probes can be spaced diagonally from each other with respect to the coater. One or more probes can be located at or near a forward corner of the coater (with respect to a direction of travel of the glass ribbon) and one or more other probes can be located at or near the diagonally opposite corner of the coater.

A plurality of coaters can be located in the float bath. Some or all of the coaters can include one or more OLCI probes. The probes can be connected to the same OLCI system or to different OCLI systems.

The float glass system can further, or alternatively, comprise at least one other optical low-coherence interferometry probe located adjacent an exit end of the float bath and connected to an optical low-coherence interferometry system. For example, the at least one other probe can be located outside of the float bath. In a preferred configuration, the at least one other probe is movably mounted on a support such that the at least one other probe can be scanned across the glass ribbon.

Another float glass system comprises a float bath having a pool of molten metal and at least one optical low-coherence interferometry probe located within the float bath and connected to an optical low-coherence interferometry system. The at least one probe can be mounted on a support in the float bath and can be either fixedly or movably mounted.

Another float glass system comprises a float bath having a pool of molten metal and at least one optical low-coherence interferometry probe located at a point past the exit end of the float bath but before the location where the glass ribbon is cut and packed. The at least one optical low-coherence interferometry probe can be connected to an optical low-coherence interferometry system.

A chemical vapor deposition coater comprises a coater housing having a bottom, with at least one transparent window in the bottom of the housing. At least one optical low-coherence interferometry probe is located in the coater housing adjacent the window. The optical low-coherence interferometry probe is connected to an optical low-coherence interferometry system.

Two or more probes can be positioned at a spaced distance from each other on the coater. For example, the probes can be spaced diagonally from each other with respect to the coater. One or more probes can be located at or near a forward corner of the coater (with respect to a direction of travel of the glass ribbon) and one or more other probes can be located at or near the diagonally opposite corner of the coater.

A method of determining a coater gap in a float glass system comprises measuring the distance from the bottom of the CVD coater to a top of a glass ribbon in a float bath using at least one OLCI probe. The method can alternatively or additionally comprise using the OLCI probe to determine the thickness of a coating and/or coating layers on the glass ribbon.

A method of determining the thickness of a glass ribbon in a float bath of a float glass system comprises measuring a thickness of a glass ribbon at one or more locations within the float bath using at least one OLCI probe located within the float bath. The method can alternatively or additionally comprise using the OLCI probe to determine the thickness of a coating and/or coating layers on the glass ribbon.

A method of determining the thickness of a glass ribbon outside of a float bath in a float glass system comprises measuring a thickness of a glass ribbon exiting the float bath using at least one OLCI probe located adjacent an exit end of the float bath. The method can alternatively or additionally comprise using the OLCI probe to determine the thickness of a coating and/or coating layers on the glass ribbon.

A method of determining the thickness of a glass ribbon in a float glass system comprises measuring a thickness of a glass ribbon at a location past the discharge end of a float bath but before the location where the glass ribbon is cut and packed using at least one OLCI probe. The OLCI probe can be positioned at a point where the glass is being cooled by the ambient atmosphere. The method can alternatively or additionally comprise using the OLCI probe to determine the thickness of a coating and/or coating layers on the glass ribbon.

The use of at least one OLCI probe to determine a coater gap of a chemical vapor deposition coater in a float bath of a float glass system.

The use of at least one OLCI probe to determine a glass ribbon thickness for a glass ribbon in a float bath of a float glass system. The probe can additionally or alternatively be used to measure the thickness of a coating on the glass ribbon.

The use of at least one OLCI probe to determine a glass ribbon thickness for a glass ribbon exiting a float bath of a float glass system. The probe can additionally or alternatively be used to measure the thickness of a coating on the glass ribbon.

BRIEF DESCRIPTION OF THE DRAWINGS

The invention will be described with reference to the following drawing figures wherein like reference numbers identify like parts throughout.

DESCRIPTION OF THE PREFERRED EMBODIMENTS

Figure 1:
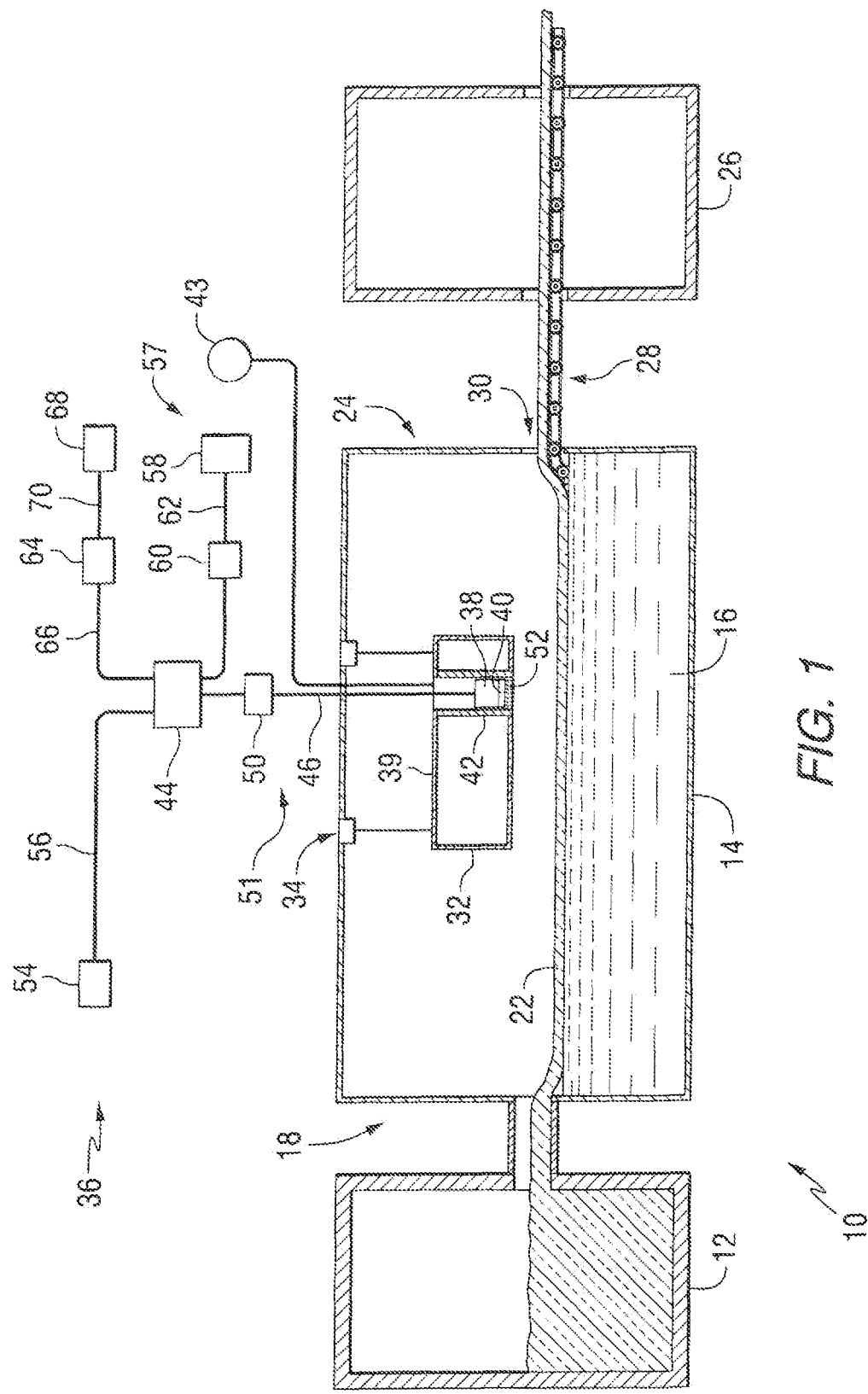
FIG. 1 is a schematic, cut-away view (not to scale) of a float glass system of the invention having a CVD coater with an OLCI probe operatively connected to an OLCI system (device)

As used herein, spatial or directional terms, such as "left", "right", "inner", "outer", "above", "below", "top", "bottom", and the like, relate to the invention as it is shown in the drawing figure. It is to be understood that the invention can assume various alternative orientations and, accordingly, such terms are not to be considered as limiting. As used herein, all numbers expressing dimensions, physical characteristics, processing parameters, quantities of ingredients, reaction conditions, and the like, used in the specification and claims are to be understood as being modified in all instances by the term "about". All ranges disclosed herein are to be understood to encompass the beginning and ending range values and any and all subranges subsumed therein. All documents, such as but not limited to, issued patents and patent applications, referred to herein are to be considered to be "incorporated by reference" in their entirety. The term "film" refers to a region of a coating having a desired or selected composition. A "layer" comprises one or more "films". A "coating" or "coating stack" is comprised of one or more "layers". The term "over" means "on or above". For example, a coating layer "formed over" a substrate does not preclude the presence of one or more other coating layers located between the formed coating layer and the substrate. By "glass ribbon path" is meant the path the glass ribbon follows during the glass manufacturing process.

Optical low-coherence interferometry (OLCI) is an optical technique that relies on the coherency of the source to provide precise determination of the optical distance between the interfaces of two materials that are optically discontinuous at those interfaces. In a typical OLCI system, the power of a low-coherence light source (such as a superluminescent diode) is divided into a sample arm and a reference arm though a coupler. The light reflected by a sample (through the sample arm) and the light reflected by a reference reflector, such as a moving mirror (reference arm), are coupled back through the coupler to a detector. Optical interference is observed when the optical pathlengths of the beams reflected by the sample and the reference reflector are the same (i.e., differ by less than the coherence length). The refractive indices of the material or materials the light passes through can used to convert these optical distances into physical distances. OLCI systems can be double path systems in which the emitted and reflected light travel along separate paths or single path systems in which the emitted and reflected light are collinear.

An exemplary float glass system 10 incorporating aspects of the invention is shown in FIG. 1. The float glass system 10 has a furnace 12 where glass batch materials are melted to form a glass melt. The furnace 12 can be an air fuel furnace or an oxyfuel furnace. A float bath 14 is located downstream of the furnace 12. The float bath 14 contains a pool of molten metal 16, such as molten tin. The glass melt is introduced into the entry end 18 of the float bath 14 and onto the top of the molten tin 16. The glass melt spreads across the surface of the molten tin 16 to form a glass ribbon 22. The glass ribbon 22 exits the float bath 14 at the exit end 24. A lehr 26 can be located downstream of the float bath 14. The glass ribbon 22 can be transported via a conventional conveyor system 28 to the lehr 26, where the glass ribbon 22 can be controllably cooled to provide glass with a controlled distribution of mechanical stress across and through the thickness of the glass ribbon (tempered), if desired. The surface of the molten metal 16 in the float bath 14 and the conveyors 28 that transport the glass ribbon out of the float bath 14 define the glass ribbon path 30 (i.e., the path the glass ribbon 22 follows during the process).

At least one chemical vapor deposition (CVD) coater 32 is located in the float bath 14. A positioning system 34 is connected to the coater 32 to raise and lower the coater 32 and/or to tilt the coater 32 (i.e., left, right, forward, backward, with respect to a direction of travel of the glass ribbon 22). The positioning system 34 can include one or more motors or positioning arms connected to the housing of the coater 32. For ease of discussion, only one CVD coater 32 is shown in FIG. 1. However, it is to be understood that more than one CVD coater 32 could be located in the float bath 14 and the invention could be practiced with each coater or with less than all of the coaters. The CVD coater 32 is configured to apply coating materials onto the top of the glass ribbon 22 as the ribbon 22 moves through the float bath 14 on top of the molten tin 16. A conventional CVD coater 32 includes a plenum block where the coating material vapors are mixed and a discharge block located on the bottom of the coater 32 where the mixed coating materials are discharged from the coater 32, such as through a coating slot, onto the top of the float glass ribbon 22. The coating materials react or combine to form a coating on top of the ribbon 22. One of ordinary skill in the float glass coating art will be familiar with the general concepts of the float glass system described so far and, therefore, a detailed explanation of the above components will not be provided.

However, in accordance with the invention, at least one OLCI assembly 36 is operatively connected to the coater 32. In the illustrated embodiment, the OLCI assembly 36 has at least one probe 38 positioned inside the float bath 14. The probe 38 can be connected to or carried on the coater 32. In the illustrated embodiment, the probe 38 is located in the coater 32, e.g., within the coater housing 39. The probe 38 is connected to a directional coupler 44 via an optical cable 46. The optical cable 46 runs through a conduit 48 formed in the coater 32 and then out of the float bath 14. The probe 38 includes a lens assembly 40 connected to the outer end of the optical cable 46. As used herein, by "inner end of the optical cable 46" is meant the end of the optical cable 46 outside of the float bath 14 (e.g., connected to the directional coupler 44) and by "outer end of the optical cable 46" is meant the opposite end of the optical cable 46. The probe 38 can include an optional housing 42, such as a stainless steel housing, to protect the lens assembly 40. The housing 42 can have an open bottom (as in the embodiment shown in FIG. 1) or the bottom of the optional housing 42 can include a transparent window or cover plate 96 (as discussed below with respect to FIG. 7) that is transparent to the light used in the OLCI system 36. The conduit 48 is connected to a cooling source 43, such as a source of cooling fluid, such as air, nitrogen, or similar fluid, to cool the interior of the conduit 48 and help prevent damage to the optical cable 46. A collimator 50 is operatively connected with the optical cable 46. In the preferred embodiment shown in FIG. 1, the collimator 50 is located outside of the float bath 14 between the probe 38 and the directional coupler 44. Alternatively, the collimator 50 can be located inside the optional housing 42. The probe 38 and optical cable 46 define the sample arm 51 of the OLCI assembly 36.

A removable, transparent window 52 is located on the bottom of the coater 32. Due to the harsh environment in the float bath 14, this window 52 should be able to withstand the high temperatures associated with the float glass process. The material for the window 52 can be any material that is optically transparent at the wavelength of the OLCI source and is sufficiently durable in the conditions to which it is exposed. Specific examples of materials useful for the window 52 include quartz and fused silica.

The window 52 can have any desired thickness. For example, the window 52 can have a thickness of at least 0.1 cm, such as at least 0.2 cm, such as at least 0.5 cm, such as at least 0.8 cm, such as at least 1 cm, such as at least 1.2 cm, such as at least 1.25 cm.

Additionally or alternatively, the window 52 can have a thickness less than or equal to 3 cm, such as less than or equal to 2 cm, such as less than or equal to 1.5 cm, such as less than or equal to 1.5 cm, such as less than or equal to 1.5 cm, such as less than or equal to 1.3 cm, such as less than or equal to 1.27 cm.

Fused silica is particularly useful for a light source with a wavelength of about 1300 nanometers (nm), such as in the range of 1300 nm to 1326 nm, such as 1310 nm, and/or in which the ambient temperature is less than 1100° C., such as less than 1050° C. In a preferred embodiment, the window 52 is made of quartz and has a thickness of 0.25 inch (1.27 cm).

The window 52 can be of any shape, such as square, rectangular, circular, oval, etc. in a preferred embodiment, the window 52 is square and has sides of 1.5 inch by 1.5 inch (3.8 cm by 3.8 cm). Preferably, the window 52 is removable from the coater 32 for cleaning or replacement. The window 52 can be connected to the coater housing in any conventional manner, such as by being carried in a frame that is attached to the coater housing by threaded connections or fasteners, such as bolts.

A light source 54 is connected to the directional coupler 44 via an optical cable 56. The reference arm 57 of the OLCI assembly 36 is defined by a reference reflector 58, such as a moving mirror, connected through another collimator 60 by an optical cable 62 to the directional coupler 44. A detector 64, such as a photodiode, is connected to the directional coupler 44 via an optical cable 66. A measurement output system 68 is connected to the detector 64, such as by an optical cable 70.

While for ease of discussion the components of the OLCI assembly 36 described above are shown separated from each other in the drawings, it will be appreciated that some or all of these components can be located in a common housing, such as with the commercially available systems noted below. For example, the collimator 50 can be located within the optional housing 42, as discussed above.

In the above discussion, the OLCI assembly 36 was described as a double path OLCI system (having separate reference and sample arms). While the double path system is preferred, the invention could also be practiced using a conventional common path OLCI assembly (in which the reference beam and the sample beam travel along the same path).

Examples of OLCI devices that can be used to practice the invention include the Fogale Nanotech Unit (LISE System), commercially available from Fogale Nanotech Inc. of San Francisco, Calif., and OptiGauge™ devices, commercially available from Lumetrics Inc. of Rochester, N.Y.

Figure 2:
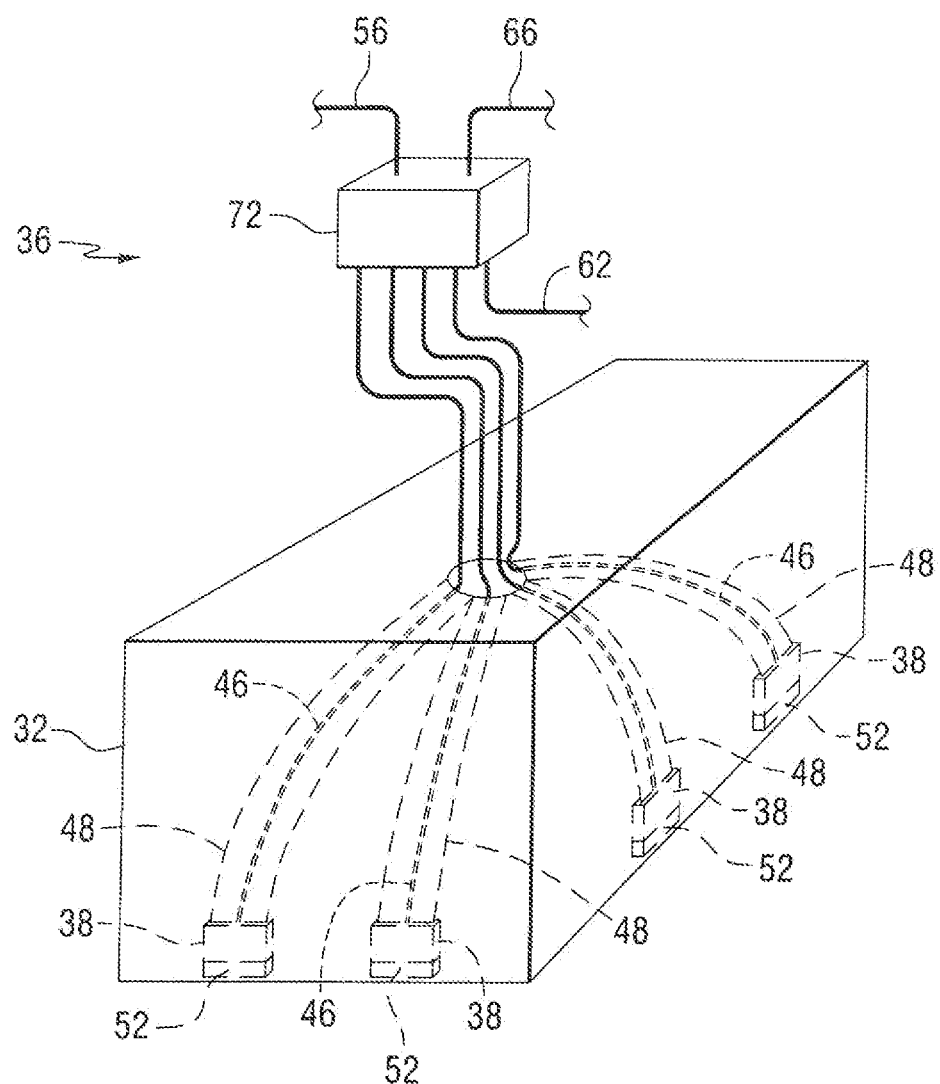
FIG. 2 is a perspective, cut-away view (not to scale) of a CVD coater of the invention incorporating multiple OLCI probes.

In the above exemplary embodiment, only one probe 38 is shown in the coater 32 simply for ease of discussion. However, as shown in FIG. 2, the coater 32 can incorporate multiple probes 38 connected to a multiplex coupler 72 via optical cables 46. The probes 38 can be positioned along the sides and/or across the front and/or across the rear and/or at diagonally opposed corners of the coater 32, to provide multiple measurements locations, as will be described in more detail below. These multiple measurements can be used to determine the tilt of the coater 32 with respect to the glass ribbon 22 (i.e., the uniformity of the coater gap across the coating area) and also to provide information regarding the thickness of the glass ribbon 22 and/or variations in thickness across the width of the ribbon 22. The probe 38 can additionally or alternatively also provide information regarding the thickness of a coating or coating layers on the glass ribbon 22. This information can be used to adjust or position the coater 32 to a desired configuration or to adjust the operating conditions of the glass pulling equipment to control the thickness of the glass ribbon 22.

The coater 32 can have two or more probes 38 positioned at a spaced distance from each other. For example, the probes 38 can be located at or near diagonally opposed corners of the coater 32. In the example illustrated in FIG. 2, one or more probes 38 is located at or near a forward corner of the coater (upper right corner of the coater 32 shown in FIG. 2) and one or more other probes 38 is located at or near the diagonally opposite corner of the coater 32 (lower left corner of the coater 32 in FIG. 2).

Figure 3:
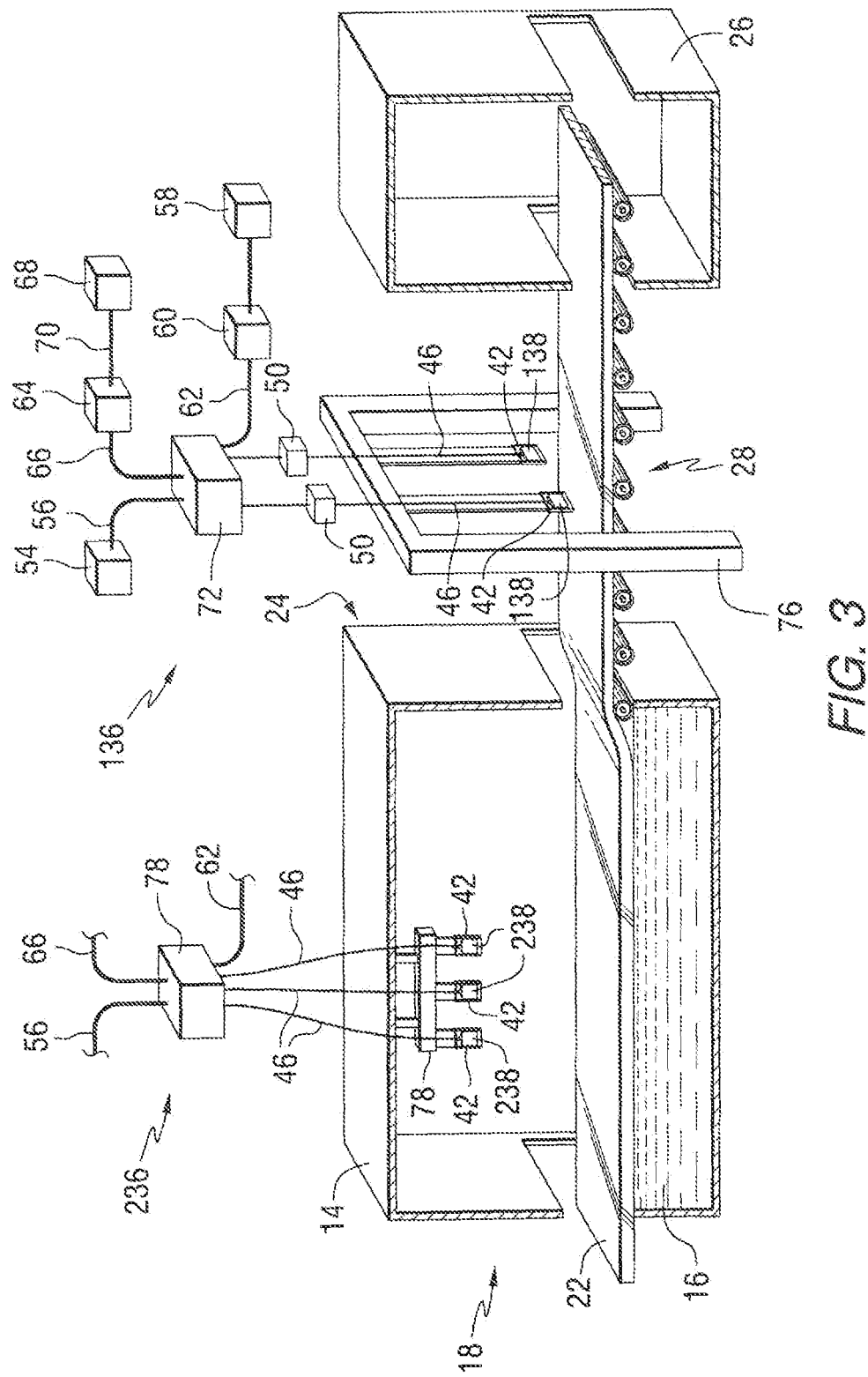
FIG. 3 is a schematic, cut-away view (not to scale) of a float glass system having an OLCI probe positioned adjacent the exit end of the float bath.

As shown in FIG. 3, one or more optional other OLCI probes 138 can be positioned above the glass ribbon 22 (i.e. above the glass ribbon path) at one or more locations downstream of the float bath 14, such as between the float bath 14 and the 26 lehr, to measure the thickness of the float glass ribbon 22 after the ribbon 22 exits the float bath 14. The probe(s) 138 can be connected to the OLCI assembly 36 described above or to a separate OLCI assembly 136, as shown in FIG. 3. The probe(s) 138 can be mounted on a support 76. In a preferred embodiment, the support 76 includes a traversing system such that the OLCI probe 138 is movable across at least a portion of the width of the glass ribbon 22 to determine the thickness of the ribbon 22 at various points across its width. Alternatively, multiple probes 138 could be positioned at fixed locations across the width of the support 76 above the glass ribbon 22 such that multiple thickness readings can be obtained. The probe(s) 138 can additionally or alternatively also provide information regarding the thickness of a coating or coating layers on the glass ribbon 22.

As also shown in FIG. 3, one or more optional further OLCI probes 238 can be installed on one or more supports 78 located within the float bath 14 (i.e. not connected directly to the coater 32). These further probe(s) 238 can be connected to the OLCI assembly 36 described above or to a separate OLCI assembly 236, as shown in FIG. 3. For example, the probe(s) 238 can be positioned at fixed locations on one or more supports 78 and connected to a multiplex coupler 72, as described above. Thus, the glass ribbon thickness can be measured at multiple locations across the width of the ribbon 22 and at multiple locations along the direction of glass ribbon 22 travel using the probe(s) 238. This information can be used to adjust the operating conditions of the glass pulling equipment to control the thickness of the glass ribbon 22. In FIG. 3, the further probes 238 in the float bath 14 are shown connected to one OLCI assembly 236 and the other probes 138 located outside of the float bath 14 are connected to another OLCI assembly 136. However, it is to be understood that the probes 238 in the float bath 14 and the probes 138 outside of the float bath 14 can be connected to the same OLCI assembly, such as the OLCI assembly 36 discussed above. The probe(s) 238 can additionally or alternatively also provide information regarding the thickness of a coating or coating layers on the glass ribbon 22.

Although various aspects of the invention described above (such as the coater 32 with OLCI probe(s) 38 shown in FIG. 1, the exterior bath other probe(s) 138 in FIG. 3, and the interior bath further probe(s) 238 shown in FIG. 3) are illustrated in separate drawings, it will be appreciated that this is simply for ease of discussion and the float glass system 10 of the invention could incorporate any one or more of these aspects or any combination of these aspects in a single process. For example, the float glass system 10 could incorporate one or more coaters 32 having one or more probes 38 as shown in FIGS. 1 and 2; and/or one or more other probes 138 located at the exit end of the float bath 14, such as at one or more locations between the float bath 14 and the lehr 26, as shown in FIG. 3; and/or one or more in bath further probes 238 positioned in the float bath 14 outside of the coater(s) 32, as shown in FIG. 3.

Figure 4:
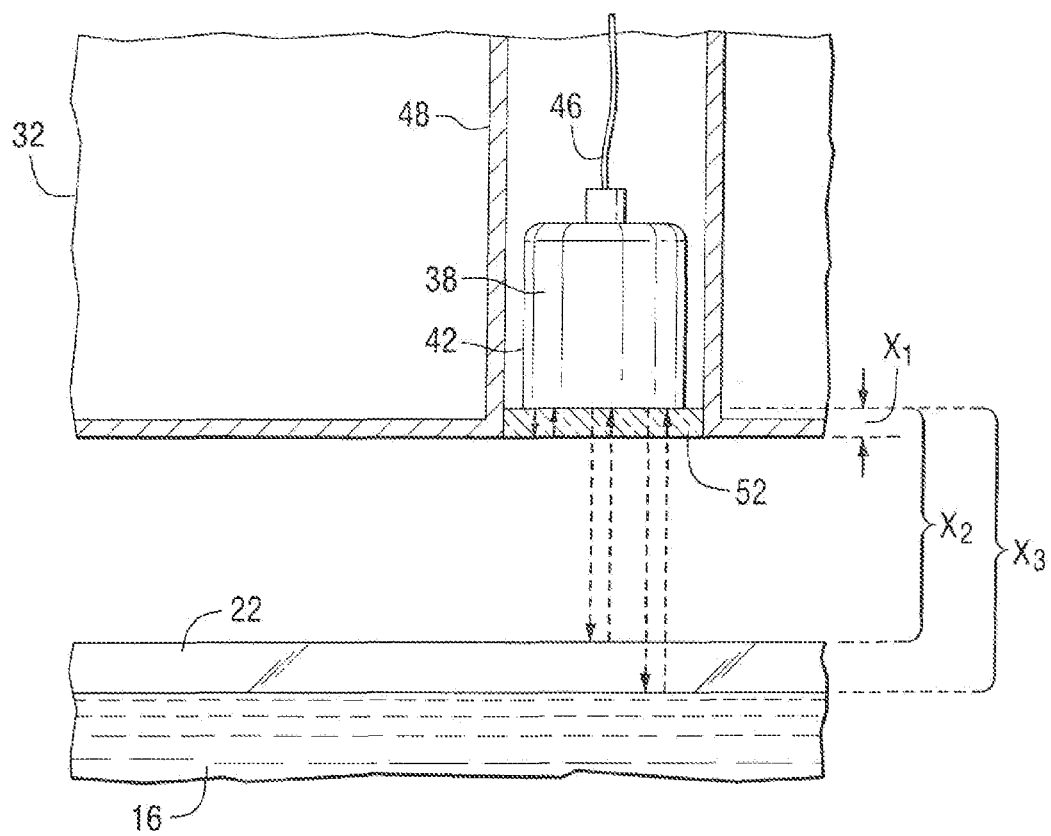
FIG. 4 is a schematic, cut-away view (not to scale) of a portion of the CVD coater and the glass ribbon of FIG. 1.

Operation of the float glass system 10 of the invention will now be described with particular reference to FIGS. 1 and 4. Light from the light source 54 is directed through the directional coupler 44 into both the sample arm 51 and the reference arm 57. In the sample arm 51, the light is directed from the probe 38, through the quartz window 52, and then through the float glass ribbon 22 on top of the molten tin 16. As shown in FIG. 4, light 80 is reflected back from the various interface surfaces. This reflected light travels to the detector 64, which calculates the distances between the interfaces. The bottom surface of the window 52 (which is preferably aligned with the bottom of the coater 32) can be used as a reference to measure the distance from the bottom of the coater 32 to the top of the glass ribbon 22.

In FIG. 4, the optical distance from the bottom of the probe 38 to the bottom of the quartz window 52 is designated $X_1$. The optical distance from the bottom of the probe 38 to the top surface of the glass ribbon 22 is designated $X_2$. The optical distance from the bottom of the probe 38 to the bottom surface of the glass ribbon 22 is designated as $X_3$. Having determined these optical distances, the coater gap can easily be determined by subtracting $X_1$ from $X_2$. Further, the optical thickness of the glass ribbon 22 can be obtained by subtracting $X_2$ from $X_3$. The physical thicknesses can be calculated from the optical thicknesses by dividing the optical thickness by the optical index (n) of the medium (e.g., glass) at the wavelength of the light source and the temperature of the medium. For example, the optical index of the ambient medium between the window 52 and the surface of the glass ribbon can be defined as n=1, while the optical index of a glass ribbon 22 at 1310 nm is typically about n=1.51. With the invention, the coater gap can be easily verified and precisely changed on a real time basis to accommodate various coating materials or deposition parameters.

As will be appreciated from the above discussion and with particular reference to FIG. 2, using multiple OLCI probes 38 in the coater 32 not only helps to determine the coater distance above the glass ribbon 22 but also can be used to determine whether the coater 32 is properly aligned with respect to the top of the glass surface, i.e. whether the coater bottom is parallel to the top of the glass ribbon 22 or is tilted with respect to the top of the glass ribbon 22. For example, in some instances, it may be desirable to tilt the coater 32 left or right or upstream or downstream with respect to the direction of travel of the glass ribbon 22. In the practice of the invention, the distance of the bottom of the coater 32 from the top of the glass ribbon 22 can be more precisely defined and the positioning system 34 can be used to raise and lower the coater 32 more precisely or to tilt the coater 32, if desired. This more precise distance measurement provides better control of the coating process and also positive safety to prevent contact of the bottom of the coater 32 with the top of the glass ribbon 22. Since there is no physical contact with the glass ribbon 22 in determining the glass ribbon thickness, the top of the glass ribbon 22 is not disturbed or marred. Additionally, with the use of a multiplex coupler 72 and multiple probes 38, multiple OLCI distance measurements can be taken across the width of the ribbon 22 to determine if there are thickness variations across the ribbon 22, which can then be corrected. Further, the probe 38 and the quartz window 52 are easily removed or installed in the coater 32, for example for replacement of the probe 38 or for cleaning or replacing the quartz window 52 if it becomes damaged by the heat in the float bath 14 or if damaged by molten metal in the float bath 14.

Figure 5:
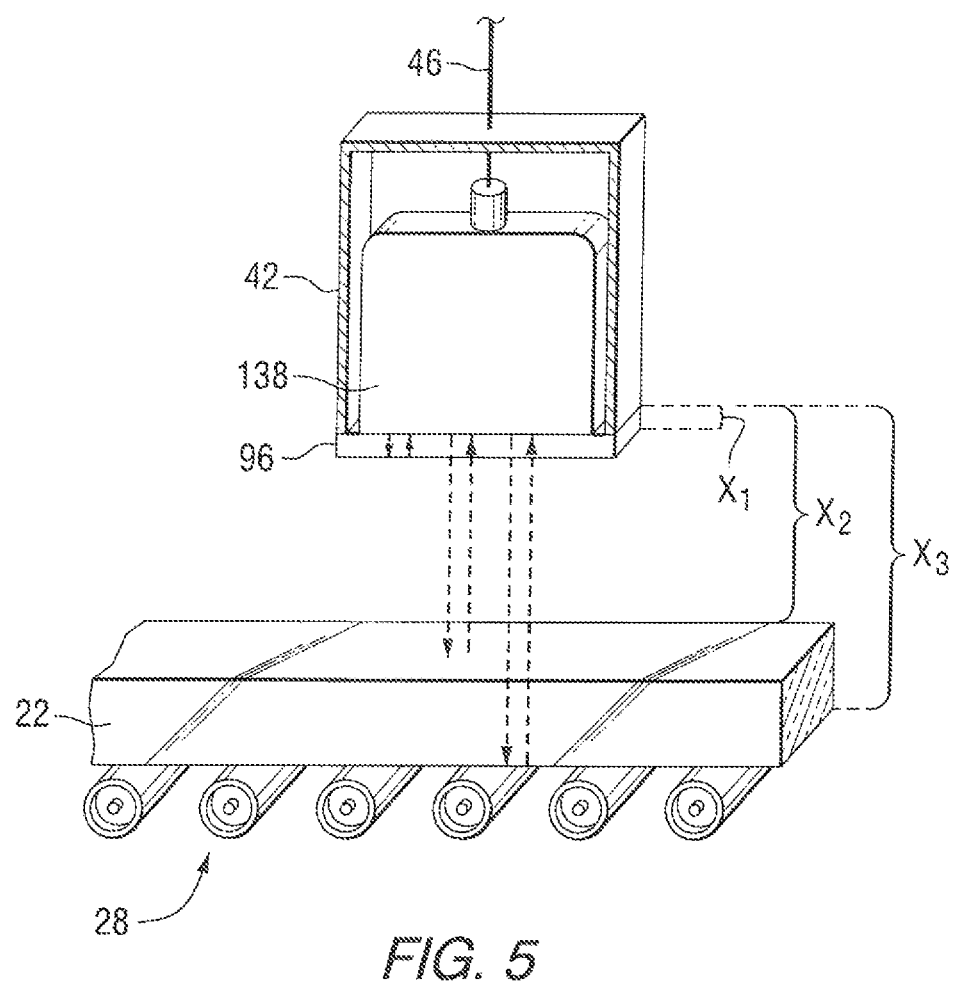
FIG. 5 is a side, cut-away view (not to scale) of a portion of the OLCI probe and glass ribbon of FIG. 3.

With respect to FIGS. 3 and 5, the OLCI device(s) located outside of the float bath 14 can be used to determine the thickness of the glass ribbon 22 as it exits the float bath 14. The housing 42 in FIG. 5 is illustrated as including the optional transparent cover plate 96. As will be appreciated from the above discussion, the OLCI probe(s) 138 on the support 76 can be used to measure the thickness of the glass ribbon 22 as it exits the float bath 14. These measurements provide information not only about the thickness of the glass ribbon 22 but also about the thickness variation (contour), if any, across the width of the glass ribbon 22. This information allows the operator to make adjustments to the float bath 14 to change the average thickness of the ribbon 22 or to adjust the thickness variation across the width of the ribbon 22 (such as to provide a more uniform thickness across the width of the ribbon 22). The OLCI probes used in the invention allow for the more accurate measurement of the glass ribbon at thicknesses above those possible with conventional systems. Also, the invention does not physically contact the top of the ribbon 22 and, therefore, will not mar the glass surface. Additionally, the thickness measurements obtained by the OLCI devices and processes of the invention do not depend on the orientation or the flatness of the glass ribbon 22. For example, if the glass ribbon 22 has minor crests and troths, such as due to movement on the conveyor system 28, the thickness measurement obtained from the OLCI probes is still a true thickness since the OLCI process measures the distance of the glass ribbon 22 from the top surface to the bottom surface (i.e. the distance between the top and bottom interface surfaces) regardless of whether those surfaces are parallel or curved.

Figure 6:
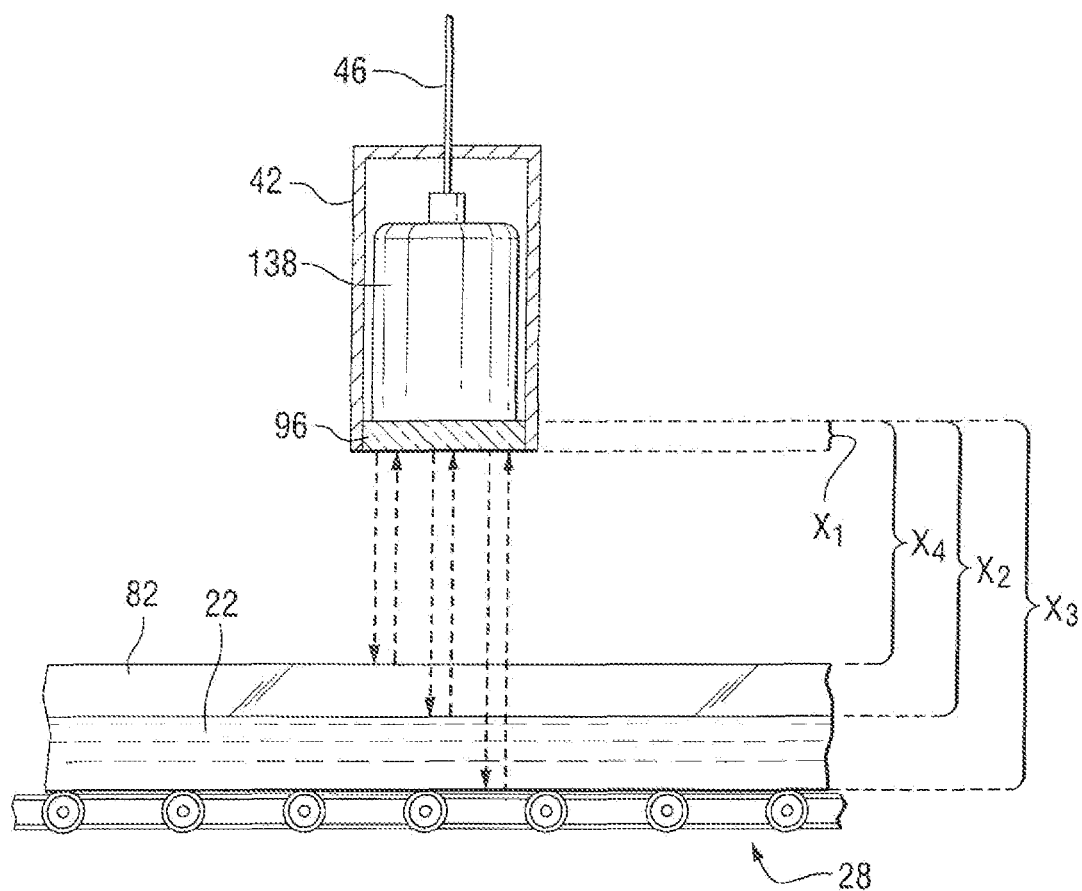
FIG. 6 is a side, cut-away view (not to scale) similar to that of FIG. 5 but illustrating a coating on the glass ribbon.

FIG. 6 is similar to FIG. 5 but shows the presence of a coating 82 over the glass ribbon 22. Thus, in the practice of the invention, not only can the thickness of the glass ribbon 22 be calculated but also the thickness of a coating 82 (including the thicknesses of the layers forming the coating 82) on the glass ribbon 22 can be calculated. In FIG. 6, the distance from the bottom of the probe 38 to the top surface of the coating 82 is designated as $X_4$. Thus, the thickness of the coating 82 is defined as $X_2$ minus $X_4$.

Figure 7:
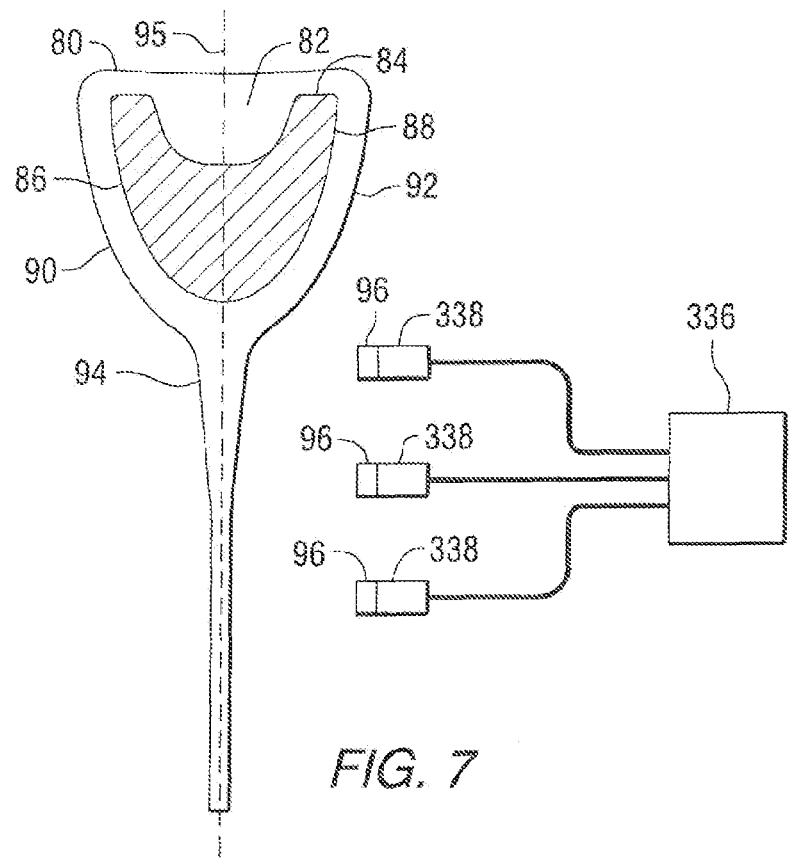
FIG. 7 is an end, cut-away view (not to scale) of a downdraw glass manufacturing process incorporating multiple OLCI probes.
Figure 8:
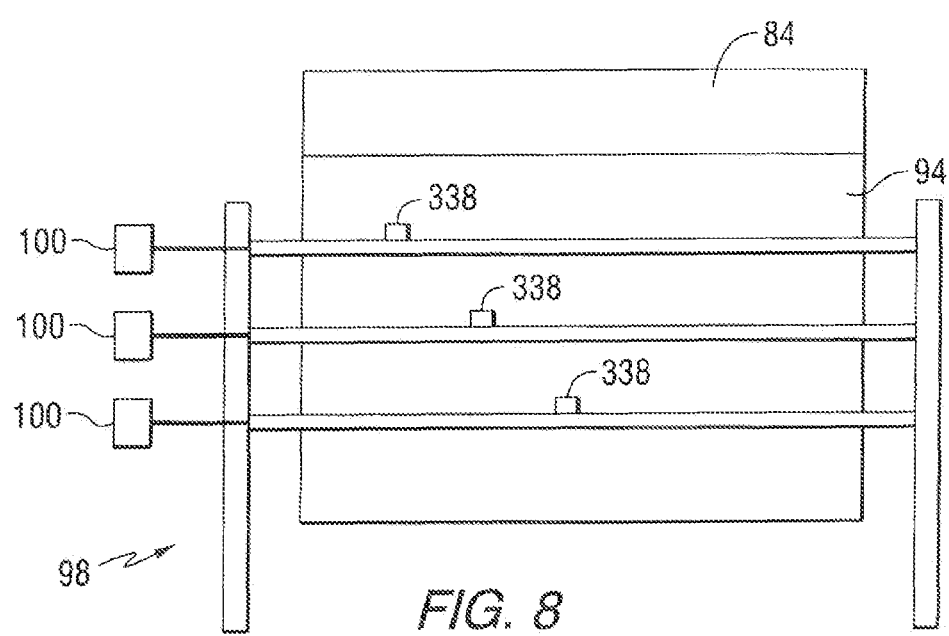
FIG. 8 is a side view (not to scale) of the downdraw process of FIG. 7.

FIGS. 7 and 8 illustrate the concept of the invention utilized with a downdraw glass manufacturing process. The downdraw process is depicted as a conventional fusion downdraw process in which molten glass 80 is delivered into a channel 82 of a forming trough 84 having opposed sides 86, 88. The molten glass 80 overflows the channel 82 and forms two glass films 90, 92 that flow downwardly along the outer surfaces of the sides 86, 88, respectively, and join together under the trough 84 to form a glass ribbon 94. The glass ribbon 94 moves downwardly under the force of gravity. The vertical plane along which the glass ribbon 94 moves defines the glass ribbon path 95 for the downdraw process. One or more probes 338 are positioned adjacent the glass ribbon 94 (La adjacent the glass ribbon path). In the illustrated embodiment, the probes 338 are similar to the probes 38, 138, and 238 described above but include a bottom cover plate 96, transparent to the light used for the OLCI system, to protect the lens assembly 40 from environmental damage. As shown in FIGS. 7 and 8, a plurality of probes 338 can be positioned at selected heights with respect to the glass ribbon 94 to determine the thickness of the glass ribbon 94 at the selected positions. The probes 338 are connected to one or more OLCI assemblies 336. The probes 338 can be fixedly mounted or, as shown in FIG. 8, the probes 338 can be mounted on a support 98 having a traversing system 100 such that the probes 338 can be moved across at least a portion of the width of the glass ribbon 94 to determine a thickness profile of the glass ribbon 94.

Example 1

Figure 9:
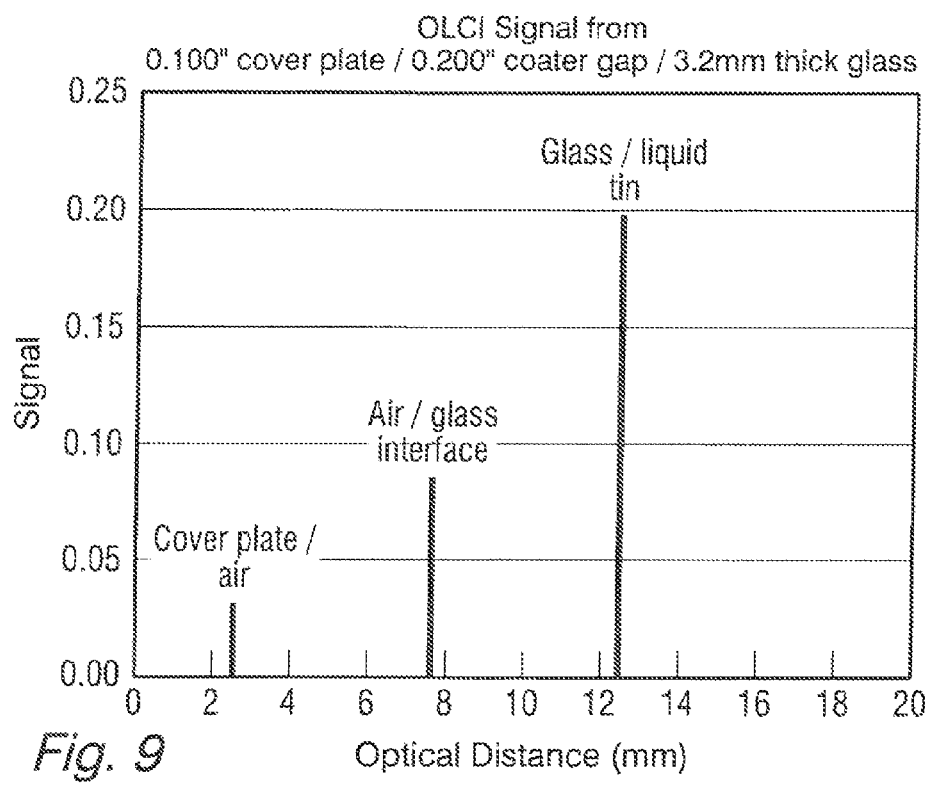
FIGS. 9-11 show optical distance data as described in Example 1.
Figure 10:
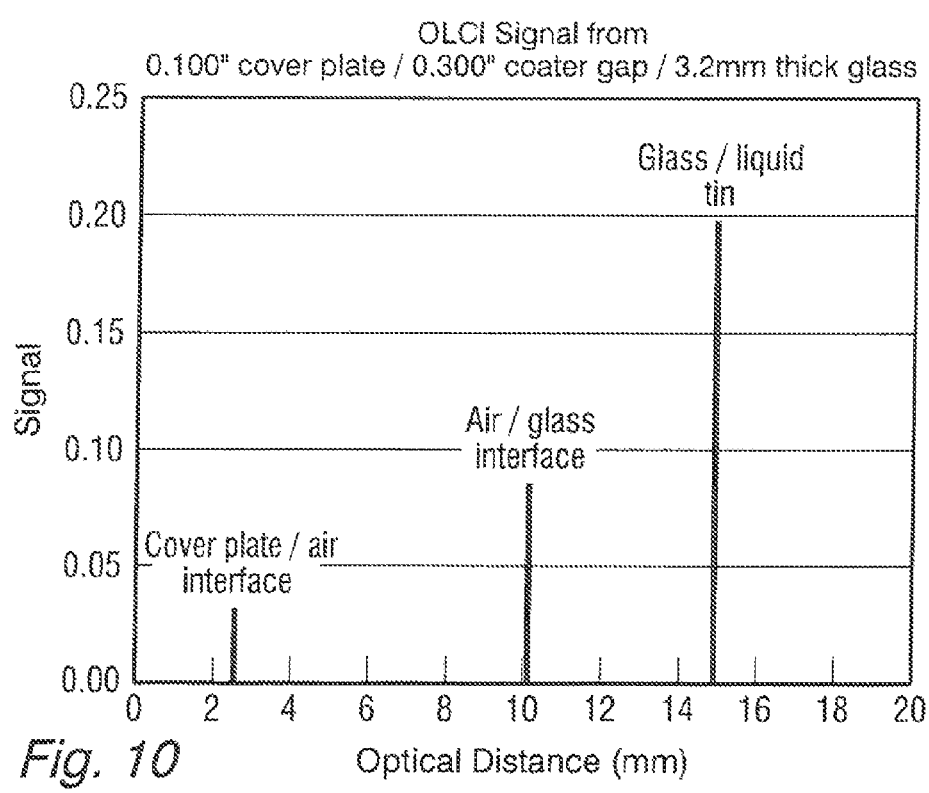
Figure 11:
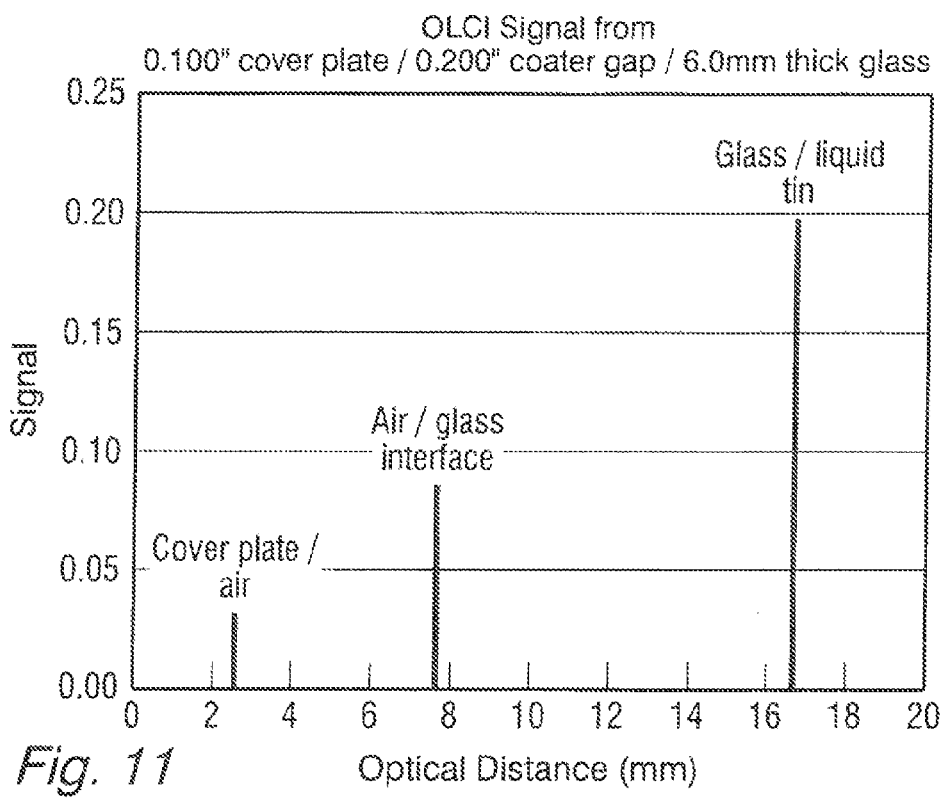
Figure 12:
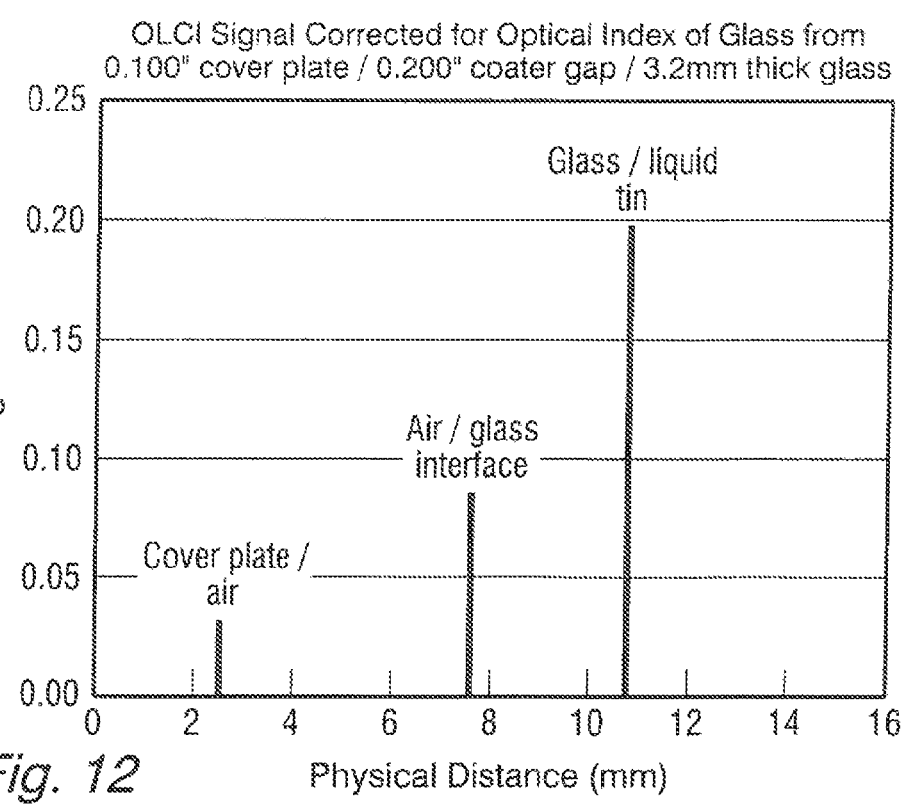
FIGS. 12-14 show physical distance data converted from the optical distance data of FIGS. 9-11.
Figure 13:
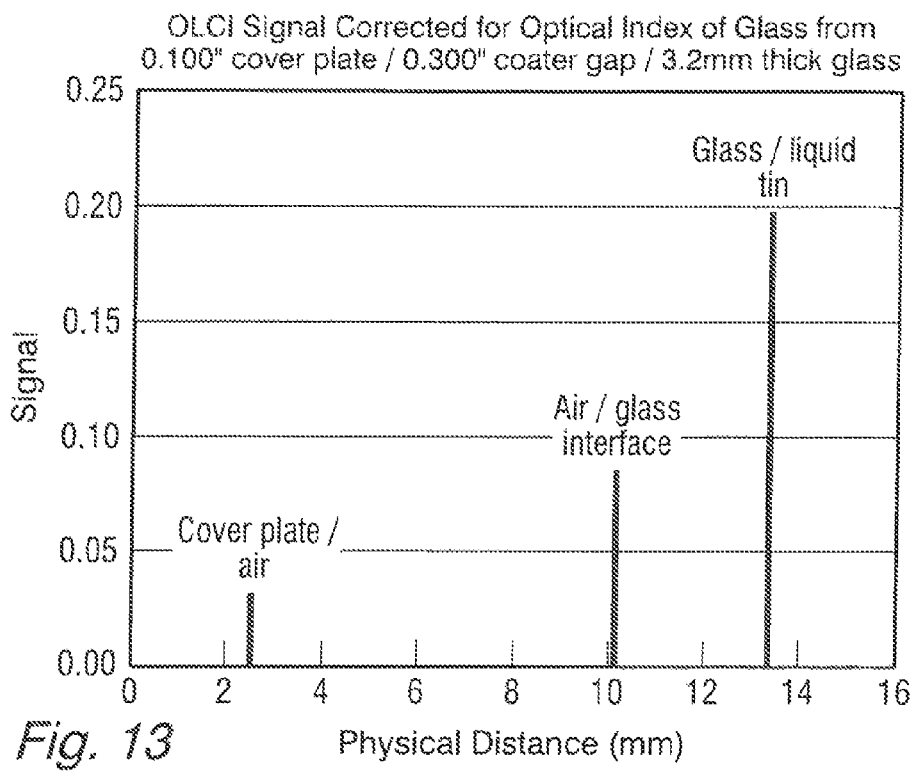
Figure 14:
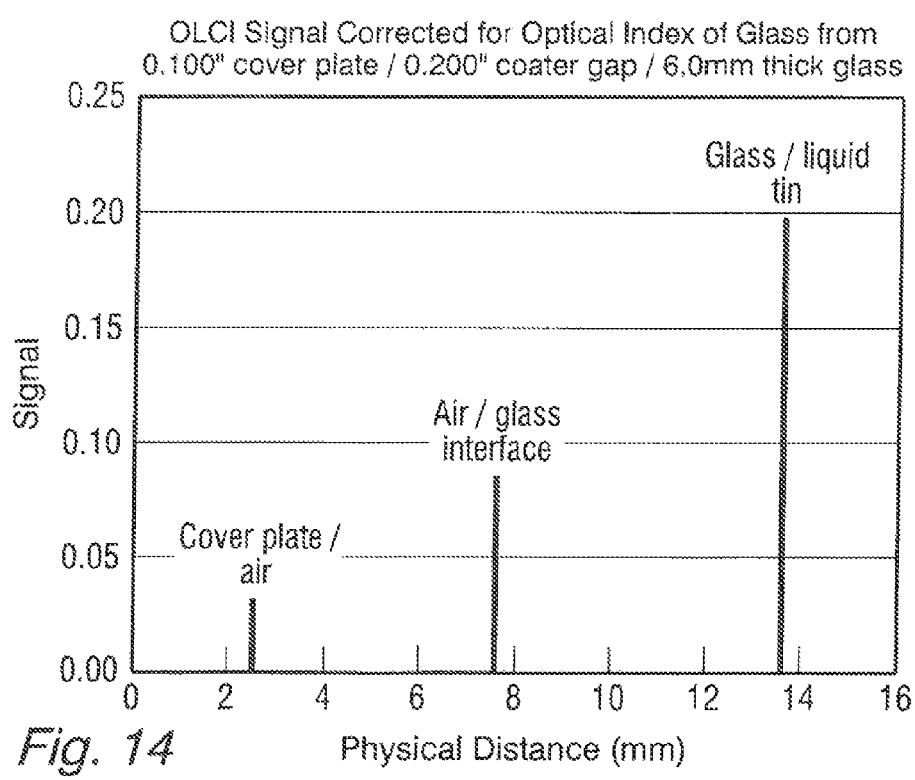

FIG. 9 shows an example of the signal from a float glass system as shown in FIG. 1 for a configuration where the coater window is mounted 0.100 inch (0.25 cm) from an arbitrary location and the bottom of the window is at the same height as the coater bottom, the glass ribbon surface is at a distance 0.200 inch (0.51 cm) below the coater bottom, and the glass is 3.2 mm thick. FIG. 10 shows an example of the signal from the system where the cover window is mounted 0.100 inch (0.25 cm) from an arbitrary location and is at the same height as the coater bottom, the glass ribbon surface is at a distance 0.300 inch (0.76 cm) below the coater bottom, and the glass is 3.2 mm thick. FIG. 11 shows an example of the signal from the system for a configuration where the cover window is mounted 0.100 inch (0.25 cm) from an arbitrary location and is at the same height as the coater bottom, the glass ribbon surface is at a distance 0.200 inch (0.51 cm) below the coater bottom, and the glass is 6.0 mm thick. FIGS. 12, 13, and 14, respectively, show the signals of FIGS. 9, 10, and 11 in which the optical distances are converted to physical distances by adjusting for the refractive indices of the materials.

It will be readily appreciated by those skilled in the art that modifications may be made to the invention without departing from the concepts disclosed in the foregoing description. For example, the various aspects of the invention shown in THE different drawing figures should not be considered as meaning those aspects must be incorporated separately. A float glass system of the invention can incorporate any one of these aspects, a combination of two or more aspects, or all of the aspects of the invention discussed above. Accordingly, the particular embodiments described in detail herein are illustrative only and are not limiting to the scope of the invention, which is to be given the full breadth of the appended claims and any and all equivalents thereof.

The invention claimed is:

1. A float glass system, comprising:
a float bath having a pool of molten metal;
at least one optical low-coherence interferometry probe located in the float bath above the pool of molten metal;
an optical low-coherence interferometry system operatively connected to the at least one optical low-coherence interferometry probe;
at least one chemical vapor deposition coater located in the float bath, with the at least one optical low-coherence interferometry probe connected to the at least one chemical vapor deposition coater;
a positioning system connected to the at least one chemical vapor deposition coater; and
at least one window located in a bottom of the at least one chemical vapor deposition coater, and with the at least one optical low-coherence interferometry probe located in the at least one chemical vapor deposition coater and aligned with the at least one window.

2. The float glass system of claim 1, wherein the at least one chemical vapor deposition coater includes a coater housing, and wherein the at least one optical low-coherence interferometry probe is located in the coater housing.

3. The float glass system of claim 1, wherein the at least one chemical vapor deposition coater includes a conduit in flow communication with a source of cooling fluid, and wherein the at least one optical low-coherence interferometry probe is connected to the low-coherence interferometry system by an optical cable extending through the conduit.

4. The float glass system of claim 1, further including at least one other optical low-coherence interferometry probe connected to a support and located adjacent an exit end of the float bath.

5. The float glass system of claim 4, wherein the at least one other optical low-coherence interferometry probe is movably mounted on the support and the support is located outside of the float bath.

6. The float glass system of claim 4, including a plurality of other optical low-coherence interferometry probes mounted on the support adjacent the exit end of the float bath and positioned adjacent the float glass ribbon path.

7. The float glass system of claim 1, wherein the at least one optical low-coherence interferometry probe comprises a lens assembly located in a probe housing.

8. The float glass system of claim 7, wherein the probe housing includes a transparent cover plate.

9. A float glass system, comprising:
a float bath having a pool of molten metal;
at least one chemical vapor deposition coater located in the float bath, wherein the at least one chemical vapor deposition coater includes a coater housing and a bottom;
at least one window located in the bottom of the at least one chemical vapor deposition coater;
at least one optical low-coherence interferometry probe connected to the at least one chemical vapor deposition coater and located in the coater housing, wherein the at least one optical low-coherence interferometry probe is aligned with the at least one window; and
an optical low-coherence interferometry system operatively connected to the at least one optical low-coherence interferometry probe.

10. The float glass system of claim 9, wherein the at least one at least one chemical vapor deposition coater includes a conduit in flow communication with a source of cooling fluid, and wherein the at least one optical low-coherence interferometry probe is connected to the low-coherence interferometry system by an optical cable extending through the conduit.

11. The float glass system of claim 9, including a positioning system connected to the at least one chemical vapor deposition coater.

12. The float glass system of claim 9, further including at least one other optical low-coherence interferometry probe connected to a support and located adjacent an exit end of the float bath.

13. The float glass system of claim 12, wherein the at least one other optical low-coherence interferometry probe is movably mounted on the support and the support is located outside of the float bath.

14. The float glass system of claim 9, wherein the at least one optical low-coherence interferometry probe comprises a lens assembly located in a probe housing.

15. The float glass system of claim 14, wherein the probe housing includes a transparent cover plate.

* * * * *